(12) United States Patent  
Razin et al.

(10) Patent No.: US 8,921,685 B2  
(45) Date of Patent: Dec. 30, 2014

(54) SOLAR POWER CAMOUFLAGE

(71) Applicants: Yosef Shmuel Razin, Princeton, NJ (US); Michael A. Paluszek, Princeton, NJ (US)

(72) Inventors: Yosef Shmuel Razin, Princeton, NJ (US); Michael A. Paluszek, Princeton, NJ (US)

(73) Assignee: Princeton Satellite Systems, Princeton, NJ (US)

( * ) Notice: Subject to any disclaimer, the term of this patent is extended or adjusted under 35 U.S.C. 154(b) by 34 days.

(21) Appl. No.: 13/715,515

(22) Filed: Dec. 14, 2012

(65) Prior Publication Data

US 2014/0060618 A1  Mar. 6, 2014

Related U.S. Application Data

(60) Provisional application No. 61/570,886, filed on Dec. 15, 2011.

(51) Int. Cl.  
*H01L 31/0203* (2014.01)  
*F41H 3/02* (2006.01)  
*H01L 31/042* (2014.01)

(52) U.S. Cl.  
CPC .............. *H01L 31/0422* (2013.01); *F41H 3/02* (2013.01)  
USPC .......................................... 136/251; 136/259

(58) Field of Classification Search  
USPC ................................................. 136/244–265  
See application file for complete search history.

(56) References Cited

U.S. PATENT DOCUMENTS

| | | | |
|---|---|---|---|
| 4,654,769 A | 3/1987 | Middlebrook | |
| 5,969,501 A | 10/1999 | Glidden et al. | |
| 6,061,259 A | 5/2000 | DeMichele | |
| 6,614,132 B2 | 9/2003 | Hockney et al. | |
| 6,811,835 B1 | 11/2004 | Parietti | |
| 6,903,537 B2 | 6/2005 | Tzeng et al. | |
| D632,494 S | 2/2011 | Bernegger et al. | |
| 8,378,656 B2 * | 2/2013 | de Rooij et al. | 323/288 |
| 2007/0039642 A1 * | 2/2007 | Lasich | 136/243 |
| 2008/0173345 A1 | 7/2008 | Cochran et al. | |
| 2009/0038672 A1 * | 2/2009 | Conger | 136/244 |
| 2009/0101192 A1 * | 4/2009 | Kothari et al. | 136/246 |
| 2009/0242021 A1 * | 10/2009 | Petkie et al. | 136/256 |
| 2011/0017280 A1 | 1/2011 | Rumsby | |
| 2011/0037439 A1 | 2/2011 | Bhardwaj et al. | |
| 2011/0088756 A1 * | 4/2011 | Fujii et al. | 136/251 |
| 2011/0185651 A1 | 8/2011 | Taylor | |
| 2011/0255196 A1 * | 10/2011 | Wu et al. | 360/244.2 |
| 2011/0290304 A1 * | 12/2011 | Daniel | 136/251 |
| 2012/0037206 A1 * | 2/2012 | Norman et al. | 136/246 |
| 2012/0249049 A1 | 10/2012 | Hixson et al. | |

FOREIGN PATENT DOCUMENTS

| | | |
|---|---|---|
| EP | 0834053 A1 | 4/1998 |
| EP | 1987547 A1 | 11/2008 |
| EP | 2494124 A1 | 9/2012 |
| EP | 2498301 A1 | 9/2012 |

* cited by examiner

*Primary Examiner* — Jayne Mershon  
(74) *Attorney, Agent, or Firm* — Fox Rothschild LLP; Richard C. Woodbridge; Ryan N. Miller

(57) ABSTRACT

A solar power camouflage system and apparatus are disclosed. The system includes a number of solar panels coupled to a net. The panels colored to produce a camouflage effect. A maximum power point tracking device coupled to the solar panels to manage to maintain the optimal voltage and current drawn through the panels. An energy storage device is coupled to the maximum power point tracking device. A power interface is coupled to said energy storage device to deliver power to other electrical devices.

20 Claims, 1 Drawing Sheet

SOLAR POWER CAMOUFLAGE

CROSS-REFERENCE TO RELATED APPLICATIONS

This application claims the benefit of Provisional Patent Application Ser. No. 61/670,886, filed Dec. 15, 2011 by the present inventors, which is incorporated herein by reference in its entirety.

FIELD OF THE INVENTION

The present disclosure generally relates to production of electric power from an array of small solar panels that also serves as protective camouflage.

BACKGROUND OF THE INVENTION

The military has a need for power for electrical equipment that is used in the field. This includes directly powering equipment and charging batteries. Examples of equipment are GPS receivers, radios and computers.

Remote military bases, possibly in hostile territory, require camouflage to mask their operations.

Currently power is provided by diesel generators. This requires the constant transport of fuel that leads to casualties in the fuel convoys. Diesel generators are noisy and a single generator leaves a remote base vulnerable to power disruptions.

Camouflage has been used for military equipment and positions. An example of a device for camouflaging military equipment consisting of a frame with several arms is described in European Patent 0 834 053 B1, the contents of which are fully incorporated by reference.

Portable solar power systems are also known. U.S. Pat. No. 5,969,501, the contents of which are fully incorporated by reference, describes a system that can fold around a trailer making it convenient to transport to its destination. U.S. Patent Application Publication No. US 2012/0249049, the contents of which are fully incorporated by reference, describes a system for vending machines with solar panels and an energy storage device.

Conformable solar panels are also known. European Patent No. 1 987 547 B1, the contents of which are fully incorporated by reference, describes a flexible solar panel for railway vehicles. U.S. Patent Application Publication No. 2011/0185651, the contents of which are fully incorporated by reference, describes a flexible solar panel with a multilayer film for building applications.

Transparent solar panels and solar cells are also known. European Patent Application Publication No. 2 498 301 A1, the contents of which are fully incorporated by reference, describes a multilayered composite sheet for transparent solar panels. U.S. Patent Application Publication No. 2011/0017280, the contents of which are fully incorporated by reference, describes a partially transparent solar panel.

U.S. Patent Application Publication No. 2008/0173345, the contents of which are fully incorporated by reference, describes a product in which the solar cells are segmented into small panels and attached to a wire net to produce an ivy effect on buildings.

None of the aforementioned solar power systems meet the needs of military operations in which the solar system must be minimally visible, conform to a plethora of shapes and be easily deployed and moved.

SUMMARY OF THE INVENTION

An aspect of the present disclosure provides a net of small solar panels in which each panel is colored to provide a camouflage pattern to mask the operations of the forces using the solar power producing net. The net comprises multiple strings of cells combined in a matrix of series and parallel connections to provide a high degree of damage tolerance. The minimal series connection of cells can produce the required DC voltage. Strings are then paralleled to provide the required current. These sets are then connected to provide redundant sets of panels so that if one or more is damaged the current and voltages are sufficient to provide power to attached electrical devices.

The solar power camouflage net can be connected to an inverter for AC power or and DC-DC regulator for DC power. The latter can be used to charge batteries found in radios, computers and other equipment The solar power camouflage net can be connected to a battery or other energy storage device to provide energy storage. The net can be rolled up for easy storage and transport. A single soldier can deploy the system.

DETAILED DESCRIPTION OF THE INVENTION

Figure 1:
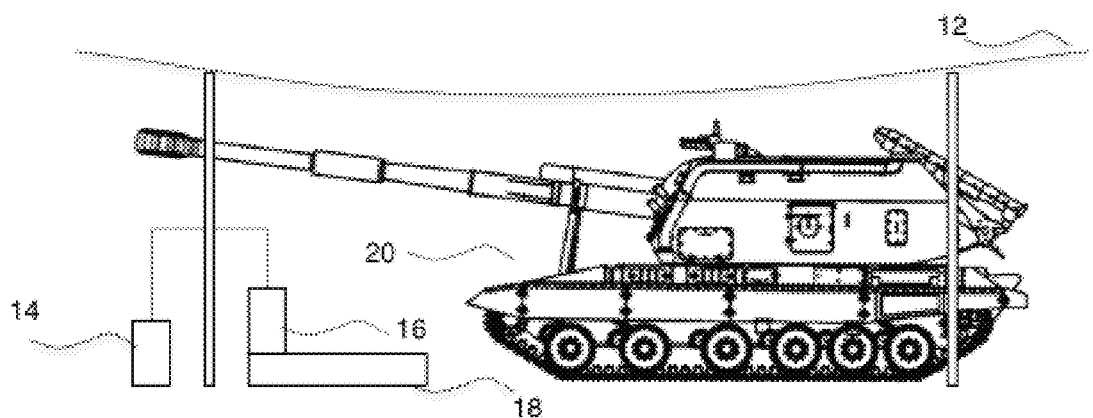
FIG. 1 an illustration of a solar power system that includes a solar power camouflage net covering a vehicle.

In the following description, for purposes of explanation, specific numbers, materials and configurations are set forth in order to provide a thorough understanding of the invention. It will be apparent, however, to one having ordinary skill in the art, that the invention may be practiced without these specific details. In some instances, well-known features may be omitted or simplified so as not to obscure the present invention. Furthermore, reference in the specification to "one embodiment" or "an embodiment" means that a particular feature, structure or characteristic described in connection with the embodiment is included in at least one embodiment of the invention. The appearances of the phrase "in an embodiment" in various places in the specification are not necessarily all referring to the same embodiment.

Although every reasonable attempt is made in the accompanying drawings to represent the various elements of the embodiments in relative scale, it is not always possible to do so with the limitations of two-dimensional paper. Accordingly, in order to properly represent the relationships of various features among each other in the depicted embodiments and to properly demonstrate the invention in a reasonably simplified fashion, it is necessary at times to deviate from absolute scale in the attached drawings. However, one of ordinary skill in the art would fully appreciate and acknowledge any such scale deviations as not limiting the enablement of the disclosed embodiments.

An aspect of the present disclosure provides a net of small solar panels in which each panel is colored to provide a camouflage pattern to mask the operations of the forces using the solar power producing net. The net consists of multiple strings of cells combined in a matrix of series and parallel connections to provide a high degree of damage tolerance. The minimal series connection of cells must produce the required DC voltage. Strings are then paralleled to provide the required current. These sets are then connected to provide redundant sets of panels so that if one or more is damaged the current and voltages are sufficient to provide power to attached electrical devices.

The solar power camouflage net can be connected to an inverter for AC power or and DC-DC regulator for DC power.

The latter can be used to charge batteries found in radios, computers and other equipment The solar power camouflage net can be connected to a battery or other energy storage device to provide energy storage. The net can be rolled up for easy storage and transport. A single soldier can deploy the system.

Because of its redundant circuits the net will produce power even after suffering considerable damage. However, its open wiring allows for rapid repair.

Conventional solar panels could be folded to provide portable solar power. However, they would make an obvious target and would advertise the position. This makes them unsuitable for Special Operations forces. The solar power camouflage net would meet all requirements for Special Operations forces.

The present disclosure advantageously provides for a camouflage net that is capable of converting solar energy to electric power. Vital assets are simultaneously protected from unnecessary exposure to visual observation and are provided with necessary power to satisfy ever increasing needs for electrical power on the battlefield. The scenarios described herein also advantageously reduce the need for fuel convoys needed to supply fossil fuel generators, thereby reducing tactical exposure and, ultimately, property and personnel casualties.

One scenario of the present disclosure is shown in FIG. 1, illustrating solar camouflage system 10. The solar panel camouflage net 12 collect solar energy for the system. In a scenario, an inverter 14 converts the power to AC. In another scenario a DC to DC converter 16 converts the power to regulated DC. The DC to DC converter 16 may be of a boost convertor with an output voltage greater than its input voltage. Alternatively, the DC to DC converter 16 may be a buck convertor with an output voltage lower than its input voltage. Multiple DC to DC converters may be included to provide multiple DC voltages to accommodate different electronic devices. Additionally, both DC and AC outputs can be provided when both inverter 14 and DC to DC converter 16 are provided. Transformerless converters and inverters are particularly desirable in this application because of their low weight and portability, however the scenarios of the present disclosure are not intended to be limited in this regard.

Energy storage device 18 may be charged by the solar cells. In one scenario, energy storage device 18 includes one or more lithium batteries or battery cells due to their long-life, low-maintenance, high power density, and high specific mass. In an alternative scenario, a flywheel device is used as energy storage device 18. In this scenario, the system 10 advantageously makes use of the redundancy inherent in the flywheel system. For example, if a flywheel fails or is damaged, another flywheel can be inserted in its place. However, the disclosed scenarios are not limited in this regard, and any device capable of storing electrical energy for future use may be used.

An armored vehicle 20 is protected from observational exposure by the solar panel camouflage net 12. Nets may be of any size depending on the application for which it will be used. For example, a small net may be suitable to cover a single soldier foxhole. In another example, a large net may be suitable to cover several vehicles, artillery pieces or other military emplacements. The scenarios of the present disclosure are not limited in this regard.

Figure 2:
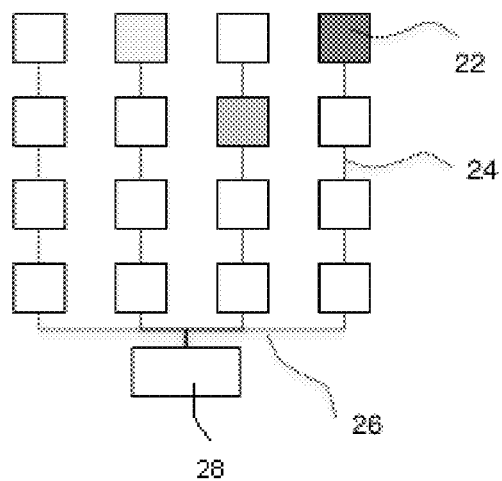
FIG. 2 is an illustration of a solar power camouflage net.

FIG. 2. shows the details of the camouflage net, e.g. solar panel camouflage net 12 of FIG. 1. Individual solar panels 22 may be colored in a camouflage pattern. Any camouflage pattern now known or to be discovered in the future will be suitable. Each solar panel 22 may be individually colored to produce a camouflage effect. In another scenario, solar panels 22 may be a combination solar panel and liquid crystal display and/or light emitting diode display. In this scenario, the camouflage pattern may change depending on the operational environment. The scenarios of the present disclosure are not limited in this regard.

The individual panels are connected in serial strings 24 which are combined in 26 parallel to produce the desired voltage and current. This protects the system from a total failure mode when damaged as the strings act independently.

The strings 24 form a grid that may take the form of a robust wire netting. The wire grid may instead be embedded in a camouflage fabric, cloth, or other type of netting. Embedding may be accomplished by sewing the strings 24 into the fabric or attaching them in place adhesively. The solar panels 22 may be flexible and embedded in the netting or cloth or they may be solely attached by the wiring.

The wire mesh connects to a maximum power point tracking device 28 that allows the system to draw the maximum possible power out of the solar panels 22. Solar panels have a complex relationship between solar irradiation, temperature, and total resistance that produces a non-linear output current-voltage (I-V) curve. The maximum power point tracking device 28 samples the output of the solar panels and applies a proper load to obtain a optimum power (i.e. optimum current and voltage). Maximum power point tracking devices are known and commonly used in solar power systems.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A solar power camouflage system comprising:
a plurality of solar panels coupled to a net, wherein each solar panel is individually colored to produce a camouflage effect, wherein each solar panel is capable of independently changing color using a light emitting display to produce a plurality of different camouflage effects depending on an operational environment of the camouflage system;
a maximum power point tracking device coupled to said solar panels to maintain an optimal voltage and current drawn through said panels;
an energy storage device coupled to said maximum power point tracking device; and
an interface coupled to said energy storage device to deliver power to other electrical devices.

2. The solar power camouflage system according to claim 1 wherein said interface is a power converter.

3. The solar power camouflage system according to claim 2 wherein said power converter is a DC to AC power inverter.

4. The solar power camouflage system according to claim 2 wherein said interface is a DC to DC converter.

5. The solar power camouflage system according to claim 4, wherein said DC to DC convertor is a buck converter.

6. The solar power camouflage system according to claim 4, wherein said DC to DC convertor is a boost converter.

7. The solar power camouflage system according to claim 1, wherein said energy storage device is a battery.

8. The solar power camouflage system according to claim 7, wherein said battery is a lithium battery.

9. The solar power camouflage system according to claim 1, wherein said energy storage device is flywheel energy storage device.

10. A solar power camouflage net comprising:
a net;
a plurality of solar panels attached to the net, wherein each solar panel is individually colored to produce a camouflage effect, wherein each solar panel is capable of independently changing color using a light emitting display to produce a plurality of different camouflage effects depending on an operational environment of the camouflage system; and
an electrical interface configured to output power generated by the plurality of solar panels attached to the net.

11. The solar power camouflage net according to claim 10, wherein at least two of the plurality of solar panels are electrically coupled to each other in series.

12. The solar power camouflage net according to claim 10, wherein at least two of the plurality of solar panels are electrically coupled to each other in parallel.

13. The solar power camouflage net according to claim 10, wherein the plurality of solar panels are arranged in a plurality of serially coupled strings of solar panels, the plurality of serially coupled strings of solar panels are coupled to each other in parallel.

14. The solar power camouflage net according to claim 13, wherein the net is a flexible fabric.

15. The solar power camouflage net according to claim 14, wherein the plurality of solar panels are coupled to the electrical interface with wires.

16. The solar power camouflage net according to claim 15, wherein the wires are sewn into the flexible fabric.

17. The solar power camouflage net according to claim 16, wherein the plurality of solar panels are embedded within the fabric.

18. The solar power camouflage net according to claim 15, wherein the wires are adhesively attached to the flexible fabric.

19. The solar power camouflage net according to claim 10, wherein the camouflage pattern changes.

20. A solar power camouflage system comprising:
a flexible camouflage net comprising a plurality of solar panels embedded within the net and arranged in a plurality of electrically coupled strings of solar panels in series, the plurality of electrically coupled strings are electrically coupled to each other in parallel, wherein each solar panel is individually colored to produce a camouflage effect, wherein the solar panels are capable of independently changing color using a light emitting display to produce a plurality of different camouflage effects;
a maximum power point tracking device coupled to said solar panels to maintain an optimal voltage and current drawn through said solar panels;
an energy storage device coupled to said maximum power point tracking device; and
a power convertor coupled to said energy storage device to deliver AC or DC power to other electrical devices.

\* \* \* \* \*